US010246994B2

(12) United States Patent
Jaffrey

(10) Patent No.: US 10,246,994 B2
(45) Date of Patent: Apr. 2, 2019

(54) SYSTEM FOR COMMUNICATING DATA VIA FLUID LINES

(71) Applicant: Cameron International Corporation, Houston, TX (US)

(72) Inventor: Andrew Jaffrey, Oldmeldrum (GB)

(73) Assignee: Cameron International Corporation, Houston, TX (US)

( * ) Notice: Subject to any disclaimer, the term of this patent is extended or adjusted under 35 U.S.C. 154(b) by 15 days.

(21) Appl. No.: 14/850,341

(22) Filed: Sep. 10, 2015

(65) Prior Publication Data

US 2017/0074091 A1 Mar. 16, 2017

(51) Int. Cl.
| | |
|---|---|
| *E21B 47/18* | (2012.01) |
| *E21B 33/064* | (2006.01) |
| *E21B 47/06* | (2012.01) |
| *E21B 47/09* | (2012.01) |
| *F16K 37/00* | (2006.01) |
| *E21B 41/00* | (2006.01) |
| *G01R 33/07* | (2006.01) |

(52) U.S. Cl.
CPC ............ *E21B 47/18* (2013.01); *E21B 33/064* (2013.01); *E21B 41/0007* (2013.01); *E21B 47/06* (2013.01); *E21B 47/065* (2013.01); *E21B 47/09* (2013.01); *F16K 37/005* (2013.01); *G01R 33/07* (2013.01)

(58) Field of Classification Search
CPC ........ E21B 47/18; E21B 47/06; E21B 47/065; E21B 33/064; E21B 47/09; F16K 37/005; G01R 33/07
USPC .......................................................... 367/83
See application file for complete search history.

(56) References Cited

U.S. PATENT DOCUMENTS

| | | |
|---|---|---|
| 5,458,200 A | 10/1995 | Lagerlef et al. |
| 2005/0179263 A1 | 8/2005 | Johansen et al. |
| 2006/0016606 A1* | 1/2006 | Tubel .................. E21B 41/0085 166/386 |

(Continued)

OTHER PUBLICATIONS

Yuanwei Jin, Deshuang Zhao, and Yujie Ying; "Time Reversal Data Communications on Pipes Using Guided Elastic Waves—Part I: Basic Principles"; Health Monitoring of Structural and Biological Systems 2011, Proc. of SPIE vol. 7984, 79840B (12 Pages).

(Continued)

*Primary Examiner* — Nader Bolourchi
(74) *Attorney, Agent, or Firm* — Helene Raybaud

(57) ABSTRACT

The present disclosure relates generally to data communication in subsea oil and gas drilling and production operations. In particular, data communication from sensors located on a piece of subsea oil and gas drilling and/or production equipment to a remote location, such as to a demodulation system, is disclosed. The data communication system can include sensors for measuring various characteristics of the subsea equipment, for coding the measured data into a signal, for transmitting the signal, and for ultimately decoding the signal. The signal is transmitted along the structures which provide the containment for existing hydraulic fluid lines associated with the subsea equipment by a variety of methods, such as by pulse position modulation and/or reverse time pulse position modulation. The communication system can further include a local power generator assembly to power associated sensors and transmitters.

18 Claims, 6 Drawing Sheets

(56) References Cited

U.S. PATENT DOCUMENTS

| | | | |
|---|---|---|---|
| 2007/0194947 A1 | 8/2007 | Huang et al. | |
| 2011/0192598 A1* | 8/2011 | Roddy | E21B 33/13 |
| | | | 166/253.1 |
| 2012/0126992 A1 | 5/2012 | Rodney et al. | |
| 2013/0080063 A1* | 3/2013 | Pillai | E21B 47/18 |
| | | | 702/9 |
| 2013/0153241 A1* | 6/2013 | Mallinson | E21B 33/0355 |
| | | | 166/363 |
| 2014/0238668 A1* | 8/2014 | Bittleston | E21B 7/00 |
| | | | 166/250.01 |
| 2016/0017683 A1* | 1/2016 | Hufthammer | E21B 21/001 |
| | | | 166/336 |

OTHER PUBLICATIONS

International Preliminary Report on Patentability and Written Opinion for the equivalent International patent application PCT/US2016/045771 dated Mar. 22, 2018.

* cited by examiner

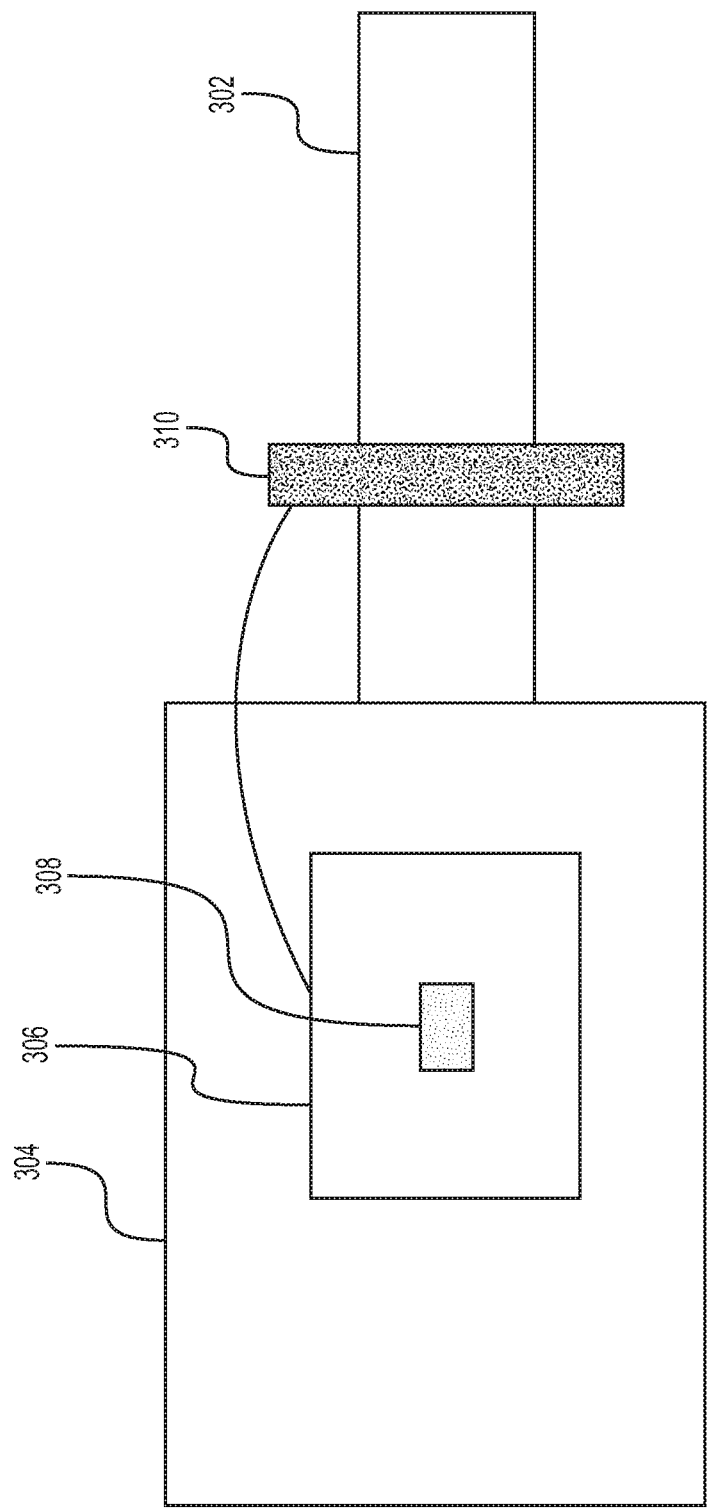

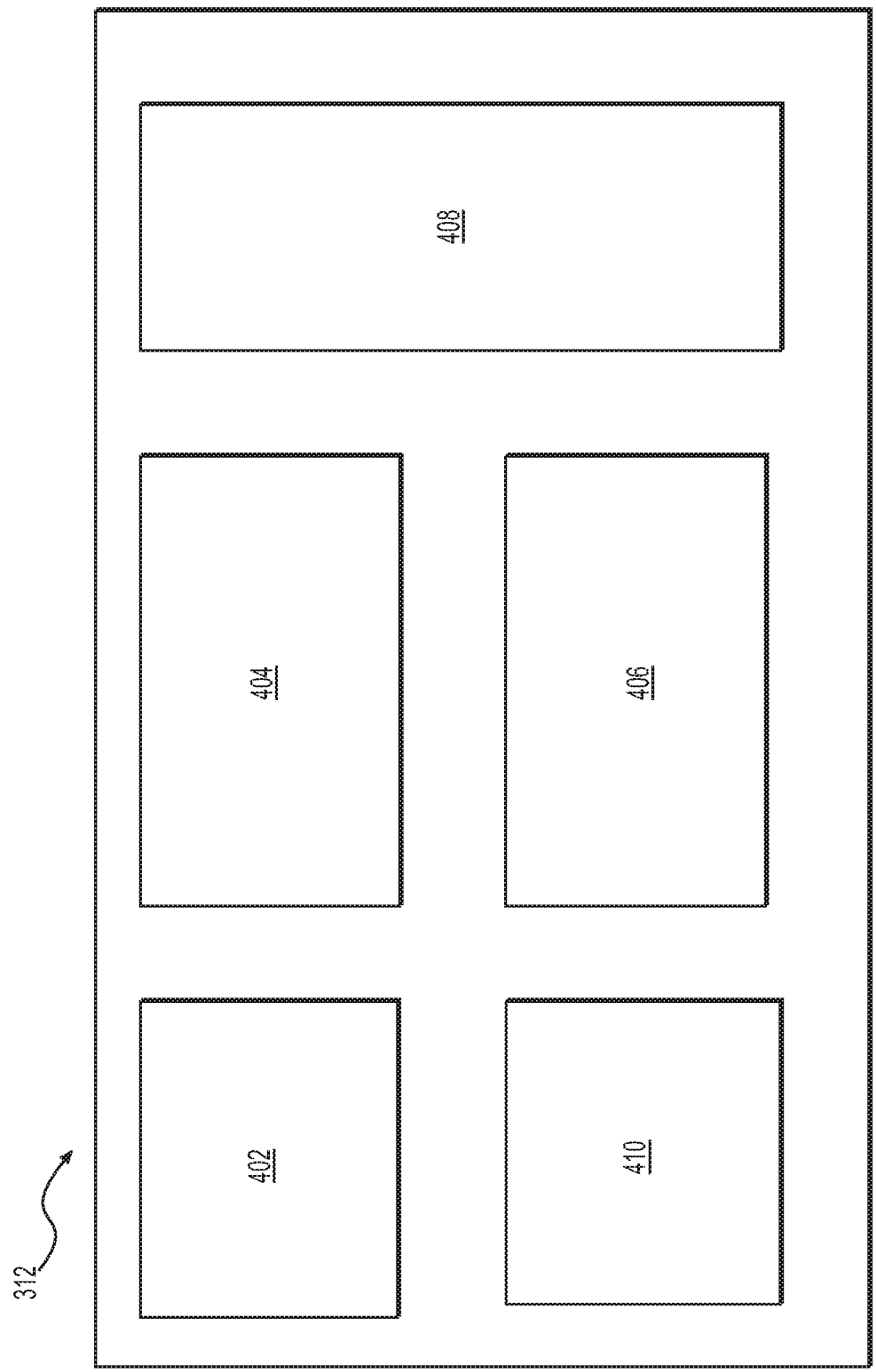

SYSTEM FOR COMMUNICATING DATA VIA FLUID LINES

BACKGROUND

This section is intended to introduce the reader to various aspects of art that may be related to various aspects of the presently described embodiments. This discussion is believed to be helpful in providing the reader with background information to facilitate a better understanding of the various aspects of the present embodiments. Accordingly, it should be understood that these statements are to be read in this light, and not as admissions of prior art.

In modern hydrocarbon drilling and production operations, there is an ever-increasing need to add more sensors and instrumentation to subsea mineral extraction equipment. However, the installation of additional sensors and instrumentation with subsea hydrocarbon drilling and production operations raises challenges regarding the infrastructure needed to supply power and handle communications to and from these sensors and instrumentation. Since subsea conditions can be hostile, minimizing the number and size of equipment near a well, such as communication wires or external batteries, is a common objective. Accordingly, there is a need for a subsea sensory system with reduced data communication infrastructure complexity. Further, there is a need for sensors and instrumentation retrofittable to existing mineral extraction equipment while minimizing additional cabling in areas not intended to accommodate cables. Also, the ability to retrofit sensors and instrumentation to existing mineral extraction equipment using minimal additional cabling in areas not originally intended to accommodate such, is an important benefit.

BRIEF DESCRIPTION OF THE DRAWINGS

Illustrative embodiments of the present disclosure are described in detail below with reference to the attached drawing figures, which are incorporated by reference herein and wherein:

FIG. 3B is a schematic view of a data communication system;

FIG. 4 is a schematic view of a central demodulation system for use with a data transmission system.

Figure 1:
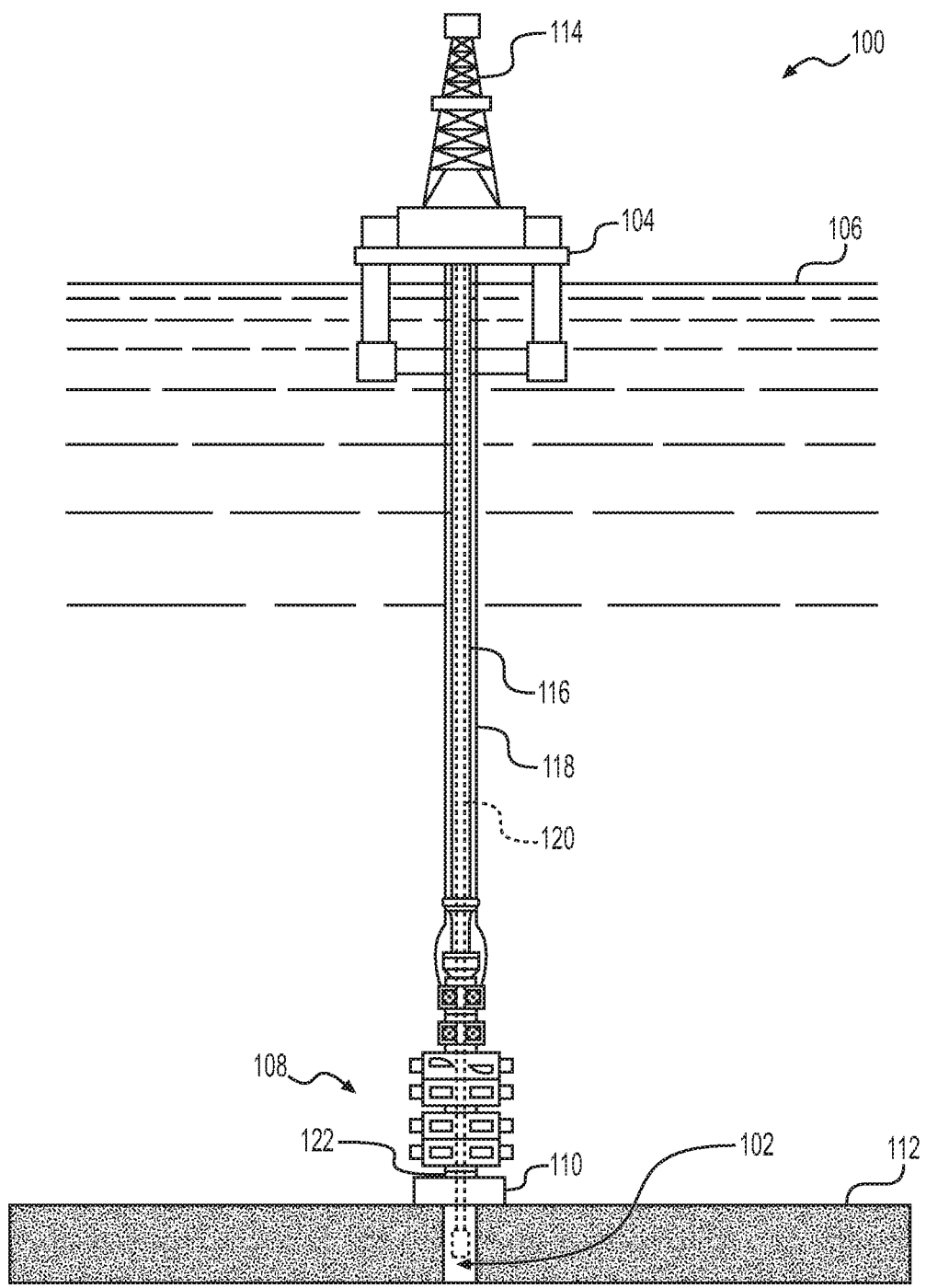
FIG. 1 is a schematic view of an example drilling system.

The illustrated figures are only exemplary and are not intended to assert or imply any limitation with regard to the environment, architecture, design, or process in which different embodiments may be implemented.

DETAILED DESCRIPTION OF ILLUSTRATIVE EMBODIMENTS

The following discussion is directed to various embodiments of the present disclosure. The drawing figures are not necessarily to scale. Certain features of the embodiments may be shown exaggerated in scale or in somewhat schematic form and some details of conventional elements may not be shown in the interest of clarity and conciseness. Although one or more of these embodiments may be preferred, the embodiments disclosed should not be interpreted, or otherwise used, as limiting the scope of the disclosure, including the claims. It is to be fully recognized that the different teachings of the embodiments discussed below may be employed separately or in any suitable combination to produce desired results. In addition, one skilled in the art will understand that the following description has broad application, and the discussion of any embodiment is meant only to be exemplary of that embodiment, and not intended to intimate that the scope of the disclosure, including the claims, is limited to that embodiment.

Certain terms are used throughout the following description and claims to refer to particular features or components. As one skilled in the art will appreciate, different persons may refer to the same feature or component by different names. This document does not intend to distinguish between components or features that differ in name but are the same structure or function.

In the following discussion and in the claims, the terms "including" and "comprising" are used in an open-ended fashion, and thus should be interpreted to mean "including, but not limited to . . . ." Also, the term "couple" or "couples" is intended to mean either an indirect or direct connection. In addition, the terms "axial" and "axially" generally mean along or parallel to a central axis (e.g., central axis of a body or a port), while the terms "radial" and "radially" generally mean perpendicular to the central axis. For instance, an axial distance refers to a distance measured along or parallel to the central axis, and a radial distance means a distance measured perpendicular to the central axis. The use of "top," "bottom," "above," "below," and variations of these terms is made for convenience, but does not require any particular orientation of the components.

Reference throughout this specification to "one embodiment," "an embodiment," or similar language means that a particular feature, structure, or characteristic described in connection with the embodiment may be included in at least one embodiment of the present disclosure. Thus, appearances of the phrases "in one embodiment," "in an embodiment," and similar language throughout this specification may, but do not necessarily, all refer to the same embodiment.

The present disclosure relates generally to data communication in subsea oil and gas drilling and production operations. In particular, the disclosure relates to data communication from sensors located on a piece of subsea oil and gas drilling and/or production equipment to a remote location, such as to demodulation system. The data communication system can include sensors for measuring various characteristics of the subsea mineral extraction equipment, for coding the measured data into a signal, for transmitting the signal, and for ultimately decoding the signal. The signal is transmitted along pipes and/or tubes associated with the subsea mineral extraction equipment, such as existing hydraulic fluid lines. By transmitting the signal along the existing fluid line, as opposed to along a wired means from the sensor to a demodulation system, communication infrastructure is simplified. The communication system can further include a power generator assembly that includes a piezoelectric material that generates an electrical charge under mechanical strain. The electrical charge is usable, for instance, to power electrically operated devices and to charge devices, such as capacitors. The mechanical strain is generated by harnessing the power of fluids already present at the subsea installation by applying these to piezoelectric material. Other suitable power generation systems are also envisioned.

Referring now to FIG. 1, an embodiment of an offshore system 100 for drilling and/or producing a wellbore 102 is shown. In this embodiment, the system 100 includes an offshore vessel or platform 104 at the sea surface 106 and a subsea blowout preventer ("BOP") stack assembly 108 mounted to a wellhead 110 at the sea floor 112. The platform 104 is equipped with a derrick 114. A tubular drilling riser 116 extends from the platform 104 to the BOP stack assembly 108. The drilling riser 116 returns drilling fluid or mud to the platform 104 during drilling operations. One or more hydraulic conduits 118 extend along the outside of the riser 116 from the platform 104 to the BOP stack assembly 108. The conduits 118 supply pressurized hydraulic fluid to the assembly 100.

Figure 2:
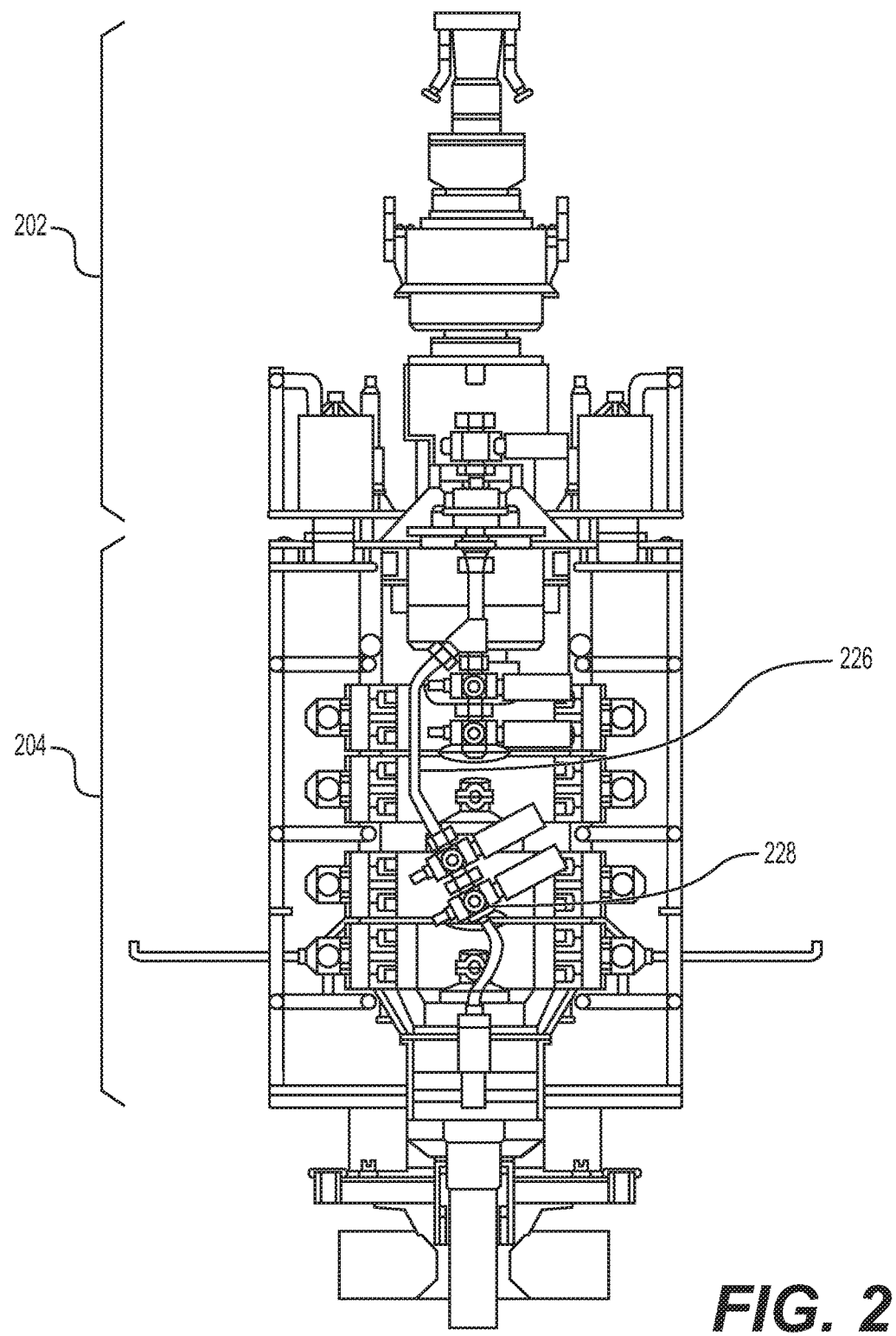
FIG. 2 is a front elevation view of a blowout preventer stack and lower marine riser package.

Referring now to FIGS. 1 and 2, the BOP stack assembly 108 is mounted to the wellhead 110 and is designed and configured to control and seal the wellbore 102, thereby containing the hydrocarbon fluids (liquids and gases) therein. In this embodiment, the BOP stack assembly 108 comprises a lower marine riser package ("LMRP") 202 and a BOP or BOP stack 204.

The BOP stack 204 is releasably secured to the wellhead 110 as well as the LMRP 202. Likewise, the LMRP 202 is releasably secured to the BOP stack 204 and the riser 116. In this embodiment, the connections between the wellhead 110, the BOP stack 204, and the LMRP 202 include hydraulically actuated, mechanical wellhead-type connections 122. In general, the connections 122 may comprise any suitable releasable wellhead-type mechanical connection such as the DWHC or HC profile subsea wellhead system available from Cameron International Corporation of Houston, Tex., or any other such wellhead profile available from several subsea wellhead manufacturers. Typically, such hydraulically actuated, mechanical wellhead-type connections (e.g., connections 122) include an upward-facing male connector, or "hub," that is received by and releasably engages a downward-facing mating female connector or receptacle. In this embodiment, the connection between LMRP 202 and the riser 116 is a flange connection that is remotely controlled, just as the connections 122 may be remotely, hydraulically controlled.

The blowout preventer assembly 108 contains conduits or lines 226 for conveying pressurized hydraulic fluid throughout the assembly. In FIG. 2, the illustrated hydraulic lines 226 are limited in number for ease of viewing and explanation. However, it is known to those of ordinary skill in the art that a blowout preventer assembly and its associated control system may comprise numerous fluid lines for distributing pressurized hydraulic fluid to a number of points on the blowout preventer, such as to an actuator (e.g., valve 228).

Figure 3A:
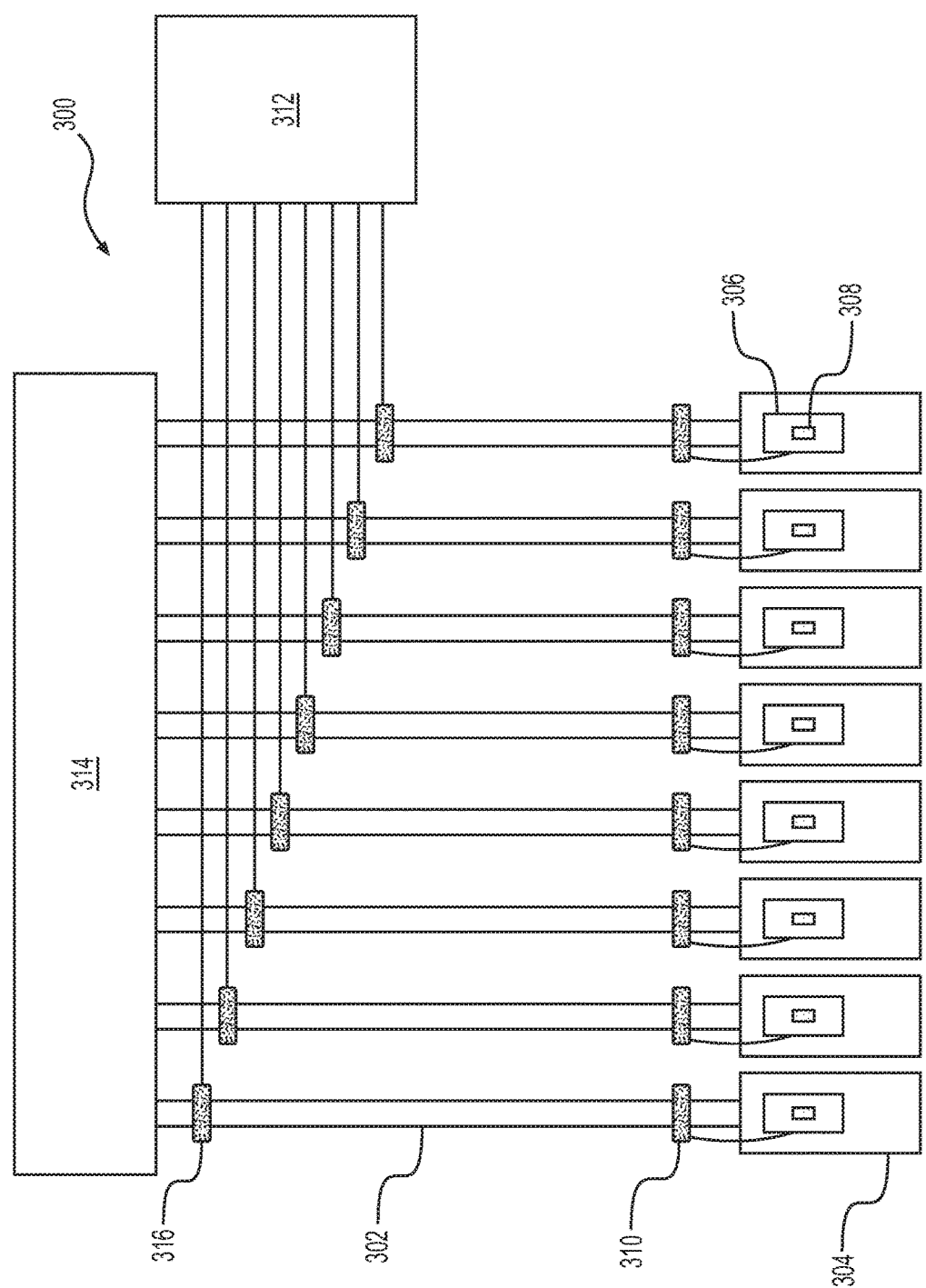
FIG. 3A is a schematic view of a plurality of pressurized fluid lines including a system for communicating data.

Turning now to FIG. 3A, a schematic view of a plurality of pressurized fluid lines 302 including a system 300 for transmitting data along the fluid lines are illustrated, by way of example. FIG. 3B shows an enlarged view of data transmission system 300.

Fluid lines 302 are hydraulic conduits similar to piping 226 illustrated in FIG. 2. Fluid lines 302 are in fluid communication with manifold 314 and are configured to convey pressurized hydraulic fluid. In FIGS. 3A and 3B, fluid lines 302 are shown coupled to subsea equipment including a plurality of valve block assemblies 304. Fluid lines 302 provide for fluid communication between manifold 314 and valve block assemblies 304. Each valve block assembly 304 may be any type of valve, such as a subsea valve associated with a piece of oil and gas extraction equipment, such as a blowout preventer stack, lower marine riser package, etc. Valve block assembly 304 includes a movable component or components within the valve block assembly 304, which are not shown. The movable elements are configured to change positions within valve block assembly 304, thereby providing for one or more fluid flow states for the valve block assembly.

Valve block assembly 304 further includes a sensor 306 located on valve block assembly 304. Sensor 306 is shown on an outer surface of valve block assembly 304. However, sensor 306 could be located at any location on or in valve block assembly 304, or even remotely relative valve block assembly 304, provided sensor 306 can measure and/or monitor characteristics and/or properties of valve block assembly 304. For instance, sensor 306 is configured to measure or monitor characteristics and/or properties of valve block assembly 304 such as, by way of example, the temperature, pressure, structural integrity, and/or fluid flow status of valve block assembly 304.

In FIGS. 3A and 3B, a single sensor 306 is shown coupled to each individual valve block assembly 304. However, any number of sensors 306 could be coupled to a single valve block assembly 304, depending on the characteristic(s) of the valve to be measured and/or monitored. That is, a single valve block assembly 304 can contain one sensor 306, a plurality of sensors 306, or no sensors 306. Sensor 306 is configured to measure and/or monitor characteristics and/or properties of valve block assembly 304 as discussed above. Sensor 306 includes a storage device 308 capable of receiving and storing sensor 306 measurement data.

One suitable type of sensor is a Hall-Effect sensor which could be attached to the outside of valve block assembly 304. A Hall-Effect sensor can provide for detection of fully open and fully closed states of valve block assembly 304 by detecting the presence or absence of movable valve components as they shuttle between positions. Such a sensor allows for determination as to whether pressurized hydraulic fluid is flowing through the valve or whether fluid flow is obstructed. Other types of sensors could also be incorporated for detecting various characteristics of valve 304, such as, for example, temperature, pressure, strain, etc.

Storage device 308 is configured to receive and store measurement data obtained and/or generated by sensor 306. Traditionally, these data are transferred to another location (e.g., a subsurface or surface demodulation system) by way of wires physically coupling sensor 306 and/or storage device 308 to the other location. As an alternative to transferring data to another location via a wired means, the present disclosure teaches using already-existing fluid lines 302 as the signal transfer medium. In particular, sensor 306 and/or storage device 308 is coupled to a signal transmitter 310 which is located on fluid line 302. In the illustrated embodiment, sensor 306 and signal transmitter 310 are shown as separate pieces of equipment. However, sensor 306 and signal transmitter 310 can be included on a single piece of equipment, as will be discussed below.

Signal transmitter 310 is configured to propagate a signal including measured data from sensor 306 to a remote location. In the illustrated embodiment, signal transmitter 310 is shown as a band located around the circumference of fluid line 302, providing a close coupling to fluid line 302, which can include contact with fluid line 302. However, no additional means for conveying the signal from signal transmitter 310 to the remote location is required, i.e., no wired-means for transferring the signal is necessary. Signal transmitter 310 can be any geometry provided the transmitter 310 is capable of propagating a signal along fluid line 302 as discussed below.

Various techniques for encoding, propagating, and decoding signals including measured data as they are transferred along the body of fluid line 302 are envisioned. For example, pulse position modulation or time reversal based pulse position modulation can be utilized to transmit a signal comprising measured data from sensor 306 to a remote location. Time reversal based pulse position modulation general comprises coupling a piezoelectric device to a pipe such that vibration caused by excitation of the piezoelectric device is transmitted into the pipe. The elastic waves imparted to the pipe as a result propagate along the length of the pipe. Similarly, when the transmitted waves are incident upon a receiving piezoelectric device, the vibration is converted into a signal that may be decoded. The signal, once transmitted by signal transmitter 310, propagates along fluid line 302 to a receiver 316 and ultimately to a demodulation system configured to decode the signal transported along fluid line 302. Multiple demodulation systems can be housed within a central demodulation system 312. This configuration allows for reduced footprint and efficiencies relating to power management, data manipulation, and storage. However, use of individual demodulation systems coupled to each individual fluid line 302 is envisioned. In addition, some demodulation systems may be grouped into a central demodulation system 312 while other individual demodulation systems may merely be coupled directed to a single fluid line 302.

Turning now to FIG. 4, a schematic view of central demodulation system 312 is shown, by way of example. The central demodulation system 312 may be in direct communication with a larger instrumentation network associated with the mineral extraction equipment being monitored or controlled. Alternatively, central demodulation system 312 may remain independent of any larger instrumentation network. The central demodulation system 312 comprises a power management system 402 for powering the central demodulation system 312. Power management system 402 includes provision for external power supply via connections which might include direct wire, inductive, battery, thermo-electric or piezoelectric generation. The power management system may include a means of storing electrical energy, such as capacitors, so that energy may be made available in a controlled manner to other sub-systems when required. Central demodulation system 312 further comprises a digital signal processor 404 configured to measure, filter, and/or compress the data signal communicated by transmitter 310. Central demodulation system 312 also includes a central processor 404, control electronics 406, and physical input/output interfaces 408 for operating central demodulation system 312. Once the signals comprising data are demodulated, the underlying data can be transferred to a remote location (e.g., to the surface if the sensor is subsea) wirelessly or through wires, saved to a data store 410 local to the demodulation system 312, and/or recovered locally at the sensor (e.g., by a remotely operated vehicle with corresponding electronics).

Figure 5:
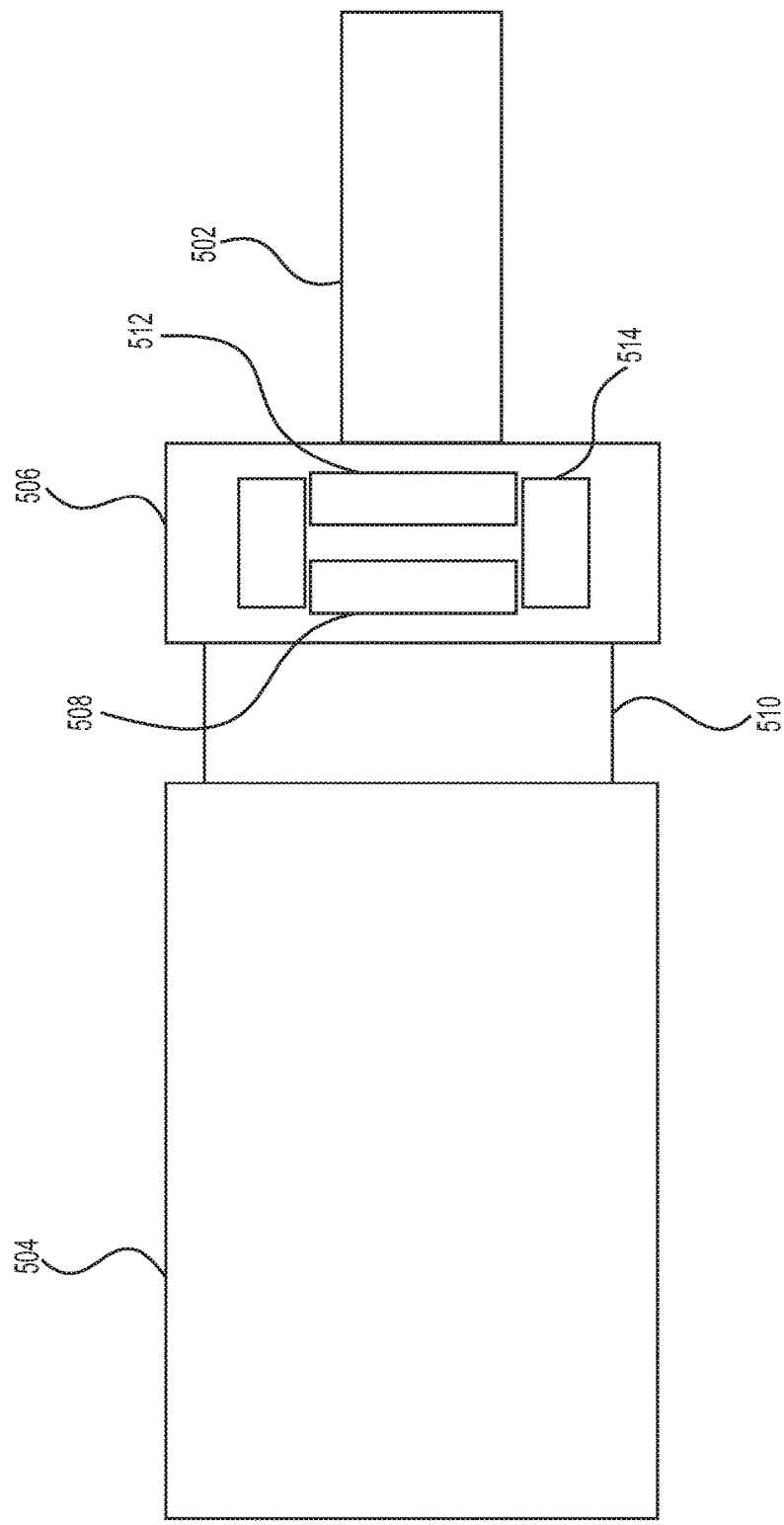
FIG. 5 is a schematic view of a data communication system including an integrated power generator.

Turning now to FIG. 5, a schematic view of a data communication system 500 is shown, by way of example. Fluid line 502 is a hydraulic conduit for conveying pressurized hydraulic fluid. Fluid line 502 is coupled to valve block assembly 504. Valve block assembly 504 may be any type of valve, such as a subsea valve associated with a piece of oil and gas extraction equipment, such as a blowout preventer stack, lower marine riser package, etc. Valve block assembly 504 includes a movable component or components within the valve block assembly 504, which are not shown. The movable elements are configured to move positions within valve block assembly 504, thereby providing for one or more fluid flow states for the valve block assembly.

Valve block assembly 504 further includes a sensor assembly 506 located in-line with the flow passage of fluid line 502. Sensor assembly 506 comprises a sensor 508 and data transmitter 510. Sensor 508 and data transmitter 510 are similar to those illustrated in FIGS. 3A and 3B and described above. Sensor assembly 506 is in line with the flow passage of fluid line 502. However, sensor assembly 506 could be located at any location on or in valve block assembly 504, or even remotely relative to valve block assembly 504, provided sensor assembly 506 can measure and/or monitor characteristics and/or properties of valve block assembly 504 and communicate signals regarding same to a remote location. For instance, sensor assembly 506 could measure and/or monitor, by way of example, the temperature, pressure, structural integrity, and/or fluid flow status of valve block assembly 504 and communication signals regarding same to a remote location.

Sensor assembly 506 further includes an integrated power generator 512 for supplying the sensor assembly 506 and all associated components with power to operate, either in whole or in part. For instance, power generator 512 can include a piezoelectric material which is located in-line with fluid line 502. Non-limiting examples of suitable piezoelectric materials include crystals (such as quartz, Berlinite and Rochelle salt) and ceramics (such as Lead Zirconate Titanate (PZT), Barium Titanate and Lithium tantalate). However, any piezoelectric material capable of accumulating an electrical charge in response to an applied mechanical stress can be used. Pressurized hydraulic fluid within and/or travelling through fluid line 502 can act on the piezoelectric material, thereby producing electrical power. The generator may also include a vibrating mechanical apparatus that responds to the hydrostatic pressure of seawater such that either ongoing or periodic vibration or excitation is applied to the piezoelectric material for continuity of electrical output. Such a vibration power generation ("VPG") device can utilize two inherent sources of vibration on a BOP. The first source being vibration of the entire assembly caused by the rotation of the drill string within the bore of the BOP. This imparts noise and vibration throughout the structure. The second source being when a component, such as a valve, is the item being measured by the RFID patch and in this case the nature of the actuation of the valve will give rise to impact vibrations that transmit through the body of the valve and can be harnessed by the VPG. This produced electrical power can be stored within the power generator (e.g., by capacitors) or can be used immediately to power the various components of sensor assembly 506. Including a power generation means within sensor assembly 506 can obviate the need for power from an external source, thereby reducing complexity at the sensor assembly 506.

Sensor assembly 506 also includes a storage device 514 configured to receive and store measurement data generated by sensor 508. Traditionally, these data are communicated to another location (e.g., a subsurface or surface demodulation system) by way of wires physically coupling sensor 508 to the other location. In the present disclosure, existing fluid line 502, as opposed to an additional communication wire, functions as the signal transfer medium. The signal transmitter 510 of sensor assembly 506 is configured to propagate a signal including measured data from sensor 508 to a remote location. In the illustrated embodiment, sensor 508 and signal transmitter 510 are shown in single, integrated assembly 506 which is in-line with the flow passage of fluid line 502.

In each of the embodiments described above, fluid lines (e.g., 302, 502) function as the medium for propagation of signals comprising data. These fluid lines are existing pieces of equipment on a mineral extraction system. As a result, no additional components, such as communication wires, need to be added to the system to communicate data from a sensor to a demodulation unit. In this way, the communication infrastructure of the system is simplified.

In addition to the embodiments described above, many examples of specific combinations are within the scope of the disclosure, some of which are detailed below:

EXAMPLE 1

A system comprising:
a piece of subsea equipment capable of fluid communication with a pressurized fluid line;
a sensor coupled to the subsea equipment and configured to measure a characteristic of the subsea equipment; and
a transmitter configured to transmit the measured characteristic via a signal along the fluid line.

EXAMPLE 2

The system of example 1, wherein the signal is received by a demodulator configured to decode the signal.

EXAMPLE 3

The system of Example 1, further comprising a plurality of pieces of subsea equipment capable of fluid communication with a plurality of pressurized fluid lines, a plurality of sensors coupled to the plurality of pieces of subsea equipment, and a plurality of transmitters.

EXAMPLE 4

The system of Example 3, wherein the plurality of transmitters transmit a plurality of measured characteristics via signals along the plurality of pressurized fluid lines.

EXAMPLE 5

The system of Example 4, wherein the plurality of signals are received by a communal demodulator configured to decode the plurality of signals.

EXAMPLE 6

The system of Example 4, wherein the plurality of signals are each received by a unique demodulator configured to decode the respective plurality of signals.

EXAMPLE 7

The system of Example 1, wherein the signal is a time reversed pulse position modulated signal.

EXAMPLE 8

The system of Example 1, wherein the signal is a pulse position modulated signal.

EXAMPLE 9

The system of Example 1, wherein the piece of subsea equipment is a blowout preventer.

EXAMPLE 10

The system of Example 1, wherein the characteristic is at least one of temperature, pressure, and position of a movable element located within the piece of subsea equipment.

EXAMPLE 11

A system for transmitting a signal along a pressurized fluid line located on and capable of fluid communication with a subsea blowout preventer comprising:
a sensor coupled to the blowout preventer and configured to measure a characteristic of the blowout preventer; and
a transmitter configured to transmit the measured characteristic via a signal along the structure which provides the containment for the fluid line.

EXAMPLE 12

The system of Example 11, wherein the signal is received by a demodulator configured to decode the signal.

EXAMPLE 13

The system of Example 11, wherein the signal is a time reversed pulse position modulated signal.

EXAMPLE 14

The system of Example 11, wherein the signal is a pulse position modulated signal.

EXAMPLE 15

The system of Example 11, wherein the characteristic is at least one of temperature, pressure, and position of a movable element located within the piece of subsea equipment.

EXAMPLE 16

The system of Example 11, wherein the sensor is coupled to a valve on the blowout preventer and the characteristic is a position of the valve.

EXAMPLE 17

The system of Example 11, wherein the sensor and transmitter are powered at least in part by a subsea power generator coupled to the system.

EXAMPLE 18

The system of Example 17, wherein the subsea power generator comprises a piezoelectric material configured to be in contact with a fluid contained in the fluid line and to generate an electrical charge when deformed by the pressure of the fluid.

EXAMPLE 19

The system of Example 18, subsea power generator further comprises a capacitor bank configured to store electrical charge.

EXAMPLE 20

The system of Example 11, further comprising a plurality of pressurized fluid lines.

While the aspects of the present disclosure may be susceptible to various modifications and alternative forms, specific embodiments have been shown by way of example in the drawings and have been described in detail herein. It should be understood that the disclosure is not intended to be limited to the particular forms disclosed. Rather, the disclosure is to cover all modifications, equivalents, and alternatives falling within the spirit and scope of the disclosure as defined by the following appended claims.

I claim:

1. A system comprising:
   a plurality of pieces of subsea equipment capable of fluid communication with a plurality of fluid pressurized lines;
   a plurality of sensors, each sensor coupled to a respective piece of subsea equipment of the plurality of pieces of subsea equipment and configured to measure a respective characteristic of the respective piece of subsea equipment;
   a plurality of transmitters each coupled to a first portion of a respective structure that provides containment for a respective pressurized fluid line of the plurality of pressurized fluid lines and are each configured to transmit the respective measured characteristic from the respective sensor via a respective signal along the respective structure that provides containment for the respective pressurized fluid line of the plurality of pressurized fluid lines; and
   a plurality of receivers each coupled to a second portion of the respective structure that provides containment for the respective pressurized fluid line of the plurality of pressurized fluid lines and are each configured to receive the respective signal transmitted along the respective structure that provides containment for the respective pressurized fluid line of the plurality of pressurized fluid lines.

2. The system of claim 1, further comprising a demodulator configured to receive the signal from the receiver and decode the signal.

3. The system of claim 1, further comprising a communal demodulator configured to receive the signals from the plurality of receivers and decode the signals.

4. The system of claim 1, further comprising a plurality of demodulators configured to receive the signals from the plurality of receivers and decode the signals.

5. The system of claim 1, wherein the signal comprises a time reversed pulse position modulated signal.

6. The system of claim 1, wherein the signal comprises a pulse position modulated signal.

7. The system of claim 1, wherein the plurality of pieces of subsea equipment comprises a blowout preventer and an associated control system.

8. The system of claim 1, wherein the measured characteristic is at least one of temperature, pressure, and position of a movable element located within the piece of subsea equipment.

9. The system of claim 7,
   wherein a sensor from the plurality of sensors is coupled to the blowout preventer and configured to measure a characteristic of the blowout preventer; and
   wherein a transmitter from the plurality of transmitters is configured to vibrate the structure that provides the containment for the fluid line located on and capable of fluid communication with the blowout preventer to transmit the measured characteristic of the blowout preventer via a signal along the structure that provides the containment for the fluid line to a respective receiver.

10. The system of claim 9, further comprising a demodulator configured to receive and decode the signal.

11. The system of claim 9, wherein the signal comprises a time reversed pulse position modulated signal.

12. The system of claim 9, wherein the signal comprises a pulse position modulated signal.

13. The system of claim 9, wherein the characteristic is at least one of temperature, pressure, and position of a movable element located within the blowout preventer.

14. The system of claim 9, wherein the sensor is coupled to a valve on the blowout preventer and the measured characteristic comprises a position of the valve.

15. The system of claim 9, further comprising a subsea power generator coupled to the system and configured to power the sensor and the transmitter.

16. The system of claim 15, wherein the subsea power generator comprises a piezoelectric material configured to be in contact with a fluid contained in the fluid line and to generate an electrical charge when deformed by the fluid.

17. The system of claim 16, wherein the subsea power generator further comprises a capacitor bank configured to store electrical charge.

18. The system of claim 9, wherein the receiver is coupled to the structure that provides the containment for the fluid line and is configured to receive the signal.

* * * * *